US009279187B2

(12) United States Patent
Wei et al.

(10) Patent No.: US 9,279,187 B2
(45) Date of Patent: Mar. 8, 2016

(54) METHOD FOR APPLYING A DIFFUSION BARRIER INTERLAYER FOR HIGH TEMPERATURE COMPONENTS

(75) Inventors: Ronghua Wei, San Antonio, TX (US); Narayana S. Cheruvu, San Antonio, TX (US)

(73) Assignee: SOUTHWEST RESEARCH INSTITUTE, San Antonio, TX (US)

( * ) Notice: Subject to any disclaimer, the term of this patent is extended or adjusted under 35 U.S.C. 154(b) by 957 days.

(21) Appl. No.: 12/616,599

(22) Filed: Nov. 11, 2009

(65) Prior Publication Data

US 2011/0111190 A1 May 12, 2011

(51) Int. Cl.
| | |
|---|---|
| C23C 14/06 | (2006.01) |
| C23C 14/08 | (2006.01) |
| C23C 28/00 | (2006.01) |
| C23C 4/08 | (2006.01) |
| C23C 4/10 | (2006.01) |
| C23C 14/00 | (2006.01) |
| C23C 14/35 | (2006.01) |
| C23C 28/04 | (2006.01) |
| F01D 5/28 | (2006.01) |
| H01J 37/34 | (2006.01) |
| C23C 14/54 | (2006.01) |

(52) U.S. Cl.
CPC .................. *C23C 28/00* (2013.01); *C23C 4/085* (2013.01); *C23C 4/10* (2013.01); *C23C 14/0036* (2013.01); *C23C 14/0641* (2013.01); *C23C 14/352* (2013.01); *C23C 28/04* (2013.01); *F01D 5/288* (2013.01); *H01J 37/3408* (2013.01); *C23C 14/081* (2013.01); *C23C 14/548* (2013.01); *Y10T 428/2495* (2015.01); *Y10T 428/265* (2015.01); *Y10T 428/31678* (2015.04)

(58) Field of Classification Search
None
See application file for complete search history.

(56) References Cited

U.S. PATENT DOCUMENTS

| | | | | |
|---|---|---|---|---|
| 4,275,124 | A | * | 6/1981 | McComas et al. ............ 428/564 |
| 5,053,245 | A | * | 10/1991 | Kiyama et al. ................ 427/566 |
| 5,077,140 | A | * | 12/1991 | Luthra et al. .................. 428/660 |
| 6,060,174 | A | * | 5/2000 | Sabol et al. ................... 428/610 |
| 6,129,991 | A | * | 10/2000 | Warnes et al. ................ 428/610 |
| 6,933,052 | B2 | | 8/2005 | Gorman et al. |
| 7,311,940 | B2 | | 12/2007 | Nagaraj et al. |
| 2005/0079368 | A1 | * | 4/2005 | Gorman et al. ............... 428/469 |
| 2007/0228664 | A1 | | 10/2007 | Anand et al. |
| 2012/0114960 | A1 | * | 5/2012 | Takesawa et al. ............. 428/565 |

OTHER PUBLICATIONS

Cheruvu et al., Evaluation of Nanocrystalline Coatings for Coal-Fired Ultra-Supercritical Boiler Tubes, Proceedings of the ASME 2009 Pressure Vessels and Piping Division Conference, Jul. 26-30, 2009, pp. 1-10, PVP2009-77092, Prague, Czech Republic.

(Continued)

*Primary Examiner* — Adam Krupicka
(74) *Attorney, Agent, or Firm* — Grossman, Tucker et al.

(57) ABSTRACT

A coated substrate and a method of forming a diffusion barrier coating system between a substrate and a MCrAl coating, including a diffusion barrier coating deposited onto at least a portion of a substrate surface, wherein the diffusion barrier coating comprises a nitride, oxide or carbide of one or more transition metals and/or metalloids and a MCrAl coating, wherein M includes a transition metal or a metalloid, deposited on at least a portion of the diffusion barrier coating, wherein the diffusion barrier coating restricts the inward diffusion of aluminum of the MCrAl coating into the substrate.

4 Claims, 15 Drawing Sheets

(56) References Cited

OTHER PUBLICATIONS

Cheruvu et al., Microstructure and oxidation resistance of nanocrystalline 304 SS-Al coatings, Surface & Coatings Technology, 2009, pp. 751-755, vol. 204.
Garwin et al., TiN High Temperature Diffusion Barrier for Copper-Gasketed Stainless-Steel Flanges, Journal of Vacuum Science and Technology, Stanford Linear Accelerator Center, Mar. 1986, pp. 1-4, Pub 3907, Stanford University, Stanford, California.
Haynes® 188 Alloy, Haynes International High-Temperature Alloys, downloaded from Internet Nov. 2009, 16 pages.
Haynes® 2300 Alloy, Haynes International High-Temperature Alloys, downloaded from Internet Nov. 2009, 28 pages.
Haynes® HR-120® alloy, Haynes International High-Temperature Alloys, downloaded from Internet Nov. 2009, 28 pages.
Haynes® HR-160® alloy, Haynes International High-Temperature Alloys, downloaded from Internet Nov. 2009, 24 pages.
Lin et al., Oxidation behavior and AlN films at high temperature under controlled atmosphere—Abstract, Department of Materials Science and Engineering, Nov. 1, 2007, 2 pages.
Liu et al., Oxidation behaviour of nanocrystalline Fe-Ni-Cr-Al alloy coatings, Materials Science and Technology, Dec. 1999, 4 pages, vol. 15.
Liu et al., Oxidation Behaviour of Sputter-Deposited Ni-Cr-Al Micro-Crystalline Coatings, Pergamon—Elsevier Science Ltd., 1998, pp. 1691-1700, vol. 46, No. 5.
Östung et al., A Comparative Study of the Diffusion Barrier Properties of TiN and ZrN, Elsevier Sequoia, Thin Solid Films, Metallurgical and Protective Coatings, 1986, pp. 81-88, vol. 145.
Shin et al., Diffusion barrier property of TiN and TiN/Al/TiN films deposited with FMCVD for Cu interconnection in ULSI, Science and Technology of Advanced Materials, 2004, pp. 399-405, vol. 5.
Stainless Steel—Grade 304, AZomaterials, downloaded from the interned Aug. 11, 2009, 4 pages.
Wang et al., High temperature stability of Zr-Si-N diffusion barrier in Cu/Si contact system, Microelectronic Engineering, 2004, pp. 69-75, vol. 71.
Wei et al., Deposition of thick nitrides and carbonitrides for sand erosion protection, Surface & Coatings Technology, 2006, pp. 4453-4459, vol. 201.
Wei, Ronghua, Plasma enhanced magnetron sputtering deposition of superhard, nanocomposite coatings, Research Signpost, Plasma Surface Engineering Research and its Practical Applications, 2008, pp. 87-111.
Wei, Ronghua, Chapter 6—Plasma Enhanced Magnetron Sputter (PEMS) Deposition of Thick Nanocomposite Coatings for Erosion Protection, 2008, 31 pages.
Wei, Ronghua, Plasma enhanced magnetron sputter deposition of Ti-Si-C-N based nanocomposite coatings, Surface & Coatings Technology, 2008, pp. 538-544, vol. 203.
Wei et al., Solid Particle Erosion Protection of Turbine Blades with Thick Nitride and Carbonitride Coatings from Magnetron Sputter Deposition, Proceedings of the 5th International Surface Engineering Congress, May 15-17, 2006, pp. 78-84.
Yamashita et al., Oxidation Behavior of Aluminum Nitride Thin Films on Superalloy Substrates, Journal of the Ceramic Society of Japan, 2004, pp. S946-S949, Supplement 112-1.
Cheruvu, et al., "Cyclic Oxidation Behavior and Microstructure of Nanocrystalline Ni-20Cr-4Al Coating," Oxid Met (2010) 73:493-511.
Wei, et al., "Effect of Deposition Parameters on MCrAl Coating Properties Using Dual Magnetron Sputter Deposition," Presented at the 53rd SVC Technical Conference in Orlando, FL, in the Heureka! session on Apr. 19, 2010, published in SVC Bulletin, 2011 Spring Bulletin, pp. 30-38.

\* cited by examiner

# METHOD FOR APPLYING A DIFFUSION BARRIER INTERLAYER FOR HIGH TEMPERATURE COMPONENTS

GOVERNMENT CONTRACT CLAUSE

This invention was made with United States Government support under Contract No. DE-FC26-07NT43096, awarded by the U.S. Department of Energy. The United States Government has certain rights in this invention.

FIELD

The present disclosure relates to a method of depositing a diffusion barrier coating between a MCrAl coating and a substrate, wherein the diffusion barrier coating may include nitrides, carbides and/or oxides.

BACKGROUND

Gas turbine components and steam turbine boiler components are rotary engines that may extract energy from a fluid or gas stream for purposes such as power generation. Such components may operate in relatively high temperature and/or oxidizing environments and may operate in frequent on-off modes depending on the system requirements. Accordingly, the turbine components may experience somewhat constant or regular thermal cycling, which may result in relatively high thermal stresses imparted to the components over the component life time, which may be, in some cases 15 to 30 years.

Coating compositions have been used to protect the turbine components from oxidation, including MCrAl type coatings, wherein M may include a transition metal such as iron, cobalt, nickel or a combination thereof. M may also include other transition metals such as manganese, yttrium, etc. Upon exposure to relatively high temperatures, (700° F. to 1000° F.,) aluminum at the outer surface of the coating may oxidize forming a relatively thin protective $Al_2O_3$ oxide layer. Where the MCrAl coating is of nanocrystalline or ultrafine grain structure, $Al_2O_3$ formation may be accelerated and in the case of nanocrystalline MCrAl coatings, the $Al_2O_3$ may adhere relatively well to the MCrAl coating, resisting spallation. Spallation may be promoted by high thermal stresses due to repetitive thermal cycling, which may then lead to the oxidation of additional aluminum and may result in the consumption of aluminum in the MCrAl coating.

Furthermore, at relatively high temperatures, aluminum may not only be consumed in oxidation but may also diffuse into the substrate, reducing aluminum available for oxidation. It may also be appreciated that while $Al_2O_3$ may adhere relatively well to nanocrystalline MCrAl coatings, a nanocrystalline coating structure may accelerate diffusion of Al through the coating and into the substrate or for consumption in oxidation. It is believed that in some cases 80 to 90% of aluminum in nanocrystalline MCrAl may be consumed in a few hundred hours of exposure at elevated temperatures, limiting the durability of the coating and potentially rendering the coating unsuitable for use in turbine applications.

SUMMARY

An aspect of the present disclosure relates to a method of forming a diffusion barrier coating system between a substrate and a MCrAl coating. The method may include depositing a diffusion barrier coating onto at least a portion of a substrate surface, wherein the diffusion barrier coating comprises a nitride, oxide or carbide of one or more transition metals and/or metalloids. The method may also include depositing a MCrAl coating, wherein M includes a transition metal or a metalloid, on at least a portion of the diffusion barrier coating, wherein the diffusion barrier coating may restrict the inward diffusion of aluminum of the MCrAl coating into the substrate.

Another aspect of the present disclosure relates to a coated substrate. The coated substrate may include a substrate having a surface, a diffusion barrier coating deposited on at least a portion of the substrate surface wherein the diffusion barrier coating comprises a nitride, oxide or carbide of one or more transition metals and/or metalloids, and a MCrAl coating, wherein M includes a transition metal or a metalloid, deposited over the diffusion barrier coating wherein the diffusion barrier coating may restrict the inward diffusion of aluminum of the MCrAl coating into the substrate.

BRIEF DESCRIPTION OF THE DRAWINGS

The above-mentioned and other features of this disclosure, and the manner of attaining them, may become more apparent and better understood by reference to the following description of embodiments described herein taken in conjunction with the accompanying drawings, wherein:

FIG. 6a illustrates an AlN diffusion barrier layer, FIG. 6b illustrates a TiN diffusion barrier layer and FIG. 6c illustrates a TiSiCN diffusion barrier layer;

DETAILED DESCRIPTION

The present disclosure relates to a method of depositing a diffusion coating between a MCrAl coating and a substrate.

The diffusion coating is one that may restrict the inward diffusion of the Al of the MCrAl coating into the substrate. Such restriction on diffusion may then preserve the availability of Al to diffuse to the top surface of the MCrAl coating and form a protective aluminum oxide layer. More specifically, the present disclosure related to the use of nitrides, carbides, or combinations thereof as a barrier coating layer between a MCrAl coating and a substrate. The coatings may be deposited by vapor deposition techniques, including chemical and/or physical vapor deposition techniques.

The substrates may be formed from iron based alloys, nickel based alloys, or other compositions. For example, the substrates may include stainless steel, such as Grade 304 or nickel-chromium-tungsten-molybdenum alloys, such as HAYNES 230 ALLOY. In some examples, the substrates may include components that may be subject to relatively high temperature environments (including temperatures of 500° F. or above) and/or oxidizing environments. Substrates that may be exposed to such environments may include gas turbine components and/or steam turbine boiler components. In addition, the substrates may be subject to constant or regular thermal cycling, which may result in relatively high thermal stresses imparted to the components over the component life time, which may be, in some examples 15 to 30 years.

As noted above, a diffusion barrier coating may be applied to the substrate, which may include nitride compositions, carbide compositions, oxide compositions and/or combinations thereof. The diffusion barrier compositions may therefore include, for example, transition metals and/or metalloids in combination with nitrogen, carbon or oxygen, to provide the a nitride, carbide or oxide composition. Examples of transition metals and metalloids include Ti, Zr, Ta, W, Al, Si, etc. It may be appreciated that examples of barrier layer compositions may include TiN, ZrN, TaN, WN, AlN, Ti—Si—N, Zr—Si—N, Ta—Si—N, Ti—Si—C—N, $Al_2O_3$, etc.

Figure 1A:
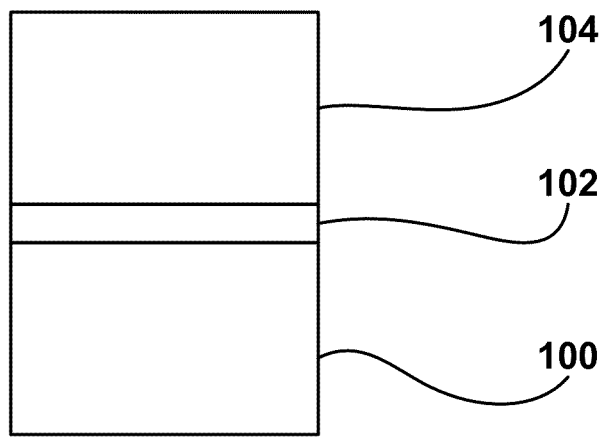
FIG. 1a illustrates an example of a cross-section of a diffusion barrier coating deposition on a portion of a substrate.
Figure 1B:
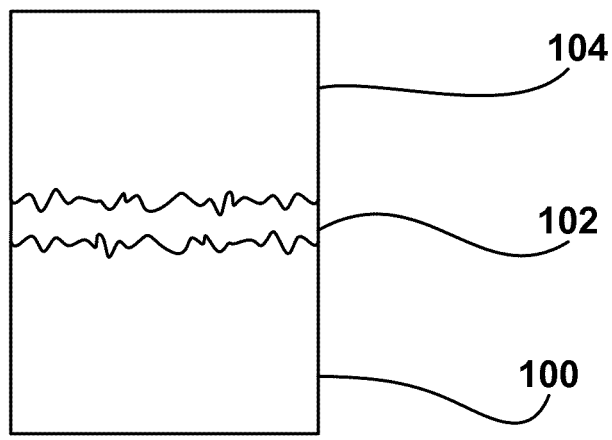
FIG. 1b illustrates an example of a cross-section of a diffusion barrier coating deposited on a portion of a substrate.

FIG. 1a illustrates an example of a diffusion barrier coating 102 deposited on at least a portion of a substrate 100. While it is illustrated that a relatively discrete interface may be formed between the barrier coating and the substrate, it should be appreciated that a less discrete interface may be present wherein the alloy compositions of the substrate and barrier coating may intermingle. FIG. 1b illustrates an example of a barrier coating 102 intermingling with the substrate 100 composition. It may be appreciated that intermingling of the coatings may be chemical and/or mechanical. For example, it may be understood that chemical intermingling may occur when the substrate alloy partially melts at the surface upon depositing of the diffusion barrier layer causing some degree of mixing or diffusion of the alloy compositions. Mechanical intermingling may be understood to occur when during deposition the diffusion barrier layer follows the substrate topology and/or fixes the diffusion barrier layer to the substrate. In addition, mechanical intermingling may also include the injection of the diffusion barrier materials into the substrate by means of ion implantation.

The diffusion barrier may also include one or more layers. Where more than one layer is present, each layer may include relatively the same compositions or may include different compositions. Layers may be provided in repeating patterns or alternating patterns, such that every other layer or every couple layers may include substantially the same composition. Furthermore, layer gradients may be provided, wherein barrier coating layers may transition into further barrier coating layers, such that there may be a first layer of a given composition, a transition phase or layer including the first and a second composition and a third layer of the second composition. The layers, individually or in combination, may exhibit a thickness in the range of about 0.1 μm to 10 μm, including all values and increments therein. It may be appreciated that where the compositions are relatively the same, impurity levels differ in the starting material feedstocks, leading to some degree of difference in the composition, such as up to 5 at %. Otherwise, changes in the elemental compositions of, for example, greater than 5 at % may lead to different compositions.

As alluded to above, an aluminum rich diffusion barrier layer may be provided, which may include Al, AlN, $Al_2O_3$, etc. In some examples, the aluminum rich layer may be provided distal from the substrate and/or closest or proximal to the MCrAl coating. An aluminum rich layer may be understood to include at least 50 at % of aluminum including all values and increments in the range of 50 at % to 99 at % aluminum.

The MCrAl coatings may be applied over the diffusion barrier coatings. FIG. 1a illustrates the application of a MCrAl coating 104 in which the coating may form a relatively discrete layer over the diffusion barrier coating. FIG. 1b illustrates an example, wherein the MCrAl layer 104 intermingles with the diffusion barrier coating. It may be appreciated that both discrete coating interfaces and/or intermingling of the various coating layers may be present and that variations in the interface may be controlled by factors such as deposition techniques, substrate temperature, coating temperatures, etc. The MCrAl coating may generally include one or more transition metals, M, chromium, Cr, and aluminum, Al. In some examples, M may include one or more transition metals or metalloids such as iron, cobalt, nickel, manganese, tungsten, tantalum, molybdenum, silicon or combinations thereof. In other examples, M may also include Y.

The various coating layers, i.e., the diffusion barrier coating and the MCrAl coating may be applied by spray, including thermal or plasma spray, chemical vapor deposition and/or by physical vapor deposition. Chemical vapor deposition may include a chemical reaction of one or more gaseous, liquid or solid precursors at elevated temperatures to form the compositions. The precursors may be volatilized and/or in the case of the liquid or solid precursors, may be dissolved in a solvent. The chemical vapor deposition may be plasma enhanced, microwave plasma assisted, remote plasma enhanced, hot wire, metalorganic, hybrid physical/chemical vapor deposition, rapid thermal, etc. Physical vapor deposition may include, for example, electron beam evaporation, cathodic arc deposition and magnetron sputtering. Furthermore, physical vapor deposition may be ion beam assisted.

Figure 2:
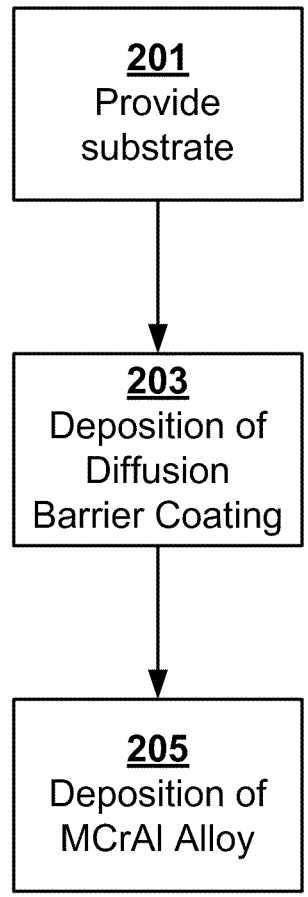
FIG. 2 illustrates an example of a deposition process for providing a diffusion barrier and MCrAl coating.

In an example of forming a diffusion barrier and MCrAl coating on a substrate, FIG. 2 illustrates a process wherein the coatings may be applied by physical vapor deposition. The process 201 may begin with providing a substrate. In an optional embodiment, the substrate may be cleaned by mechanical and/or chemical processes, such as shot peening or chemical etching. One or more diffusion barrier coating layers may be deposited onto at least a portion of a surface of the substrate 203 using physical vapor deposition, including, but not limited to, magnetron sputtering, electron beam evaporation or arc deposition, etc. The MCrAl coating may then be provided over at least a portion of the diffusion barrier coating layer 205. The MCrAl coating may be deposited over the diffusion barrier coating using physical vapor deposition, including, but not limited to, magnetron sputtering, electron beam evaporation or arc deposition, etc.

Figure 3:
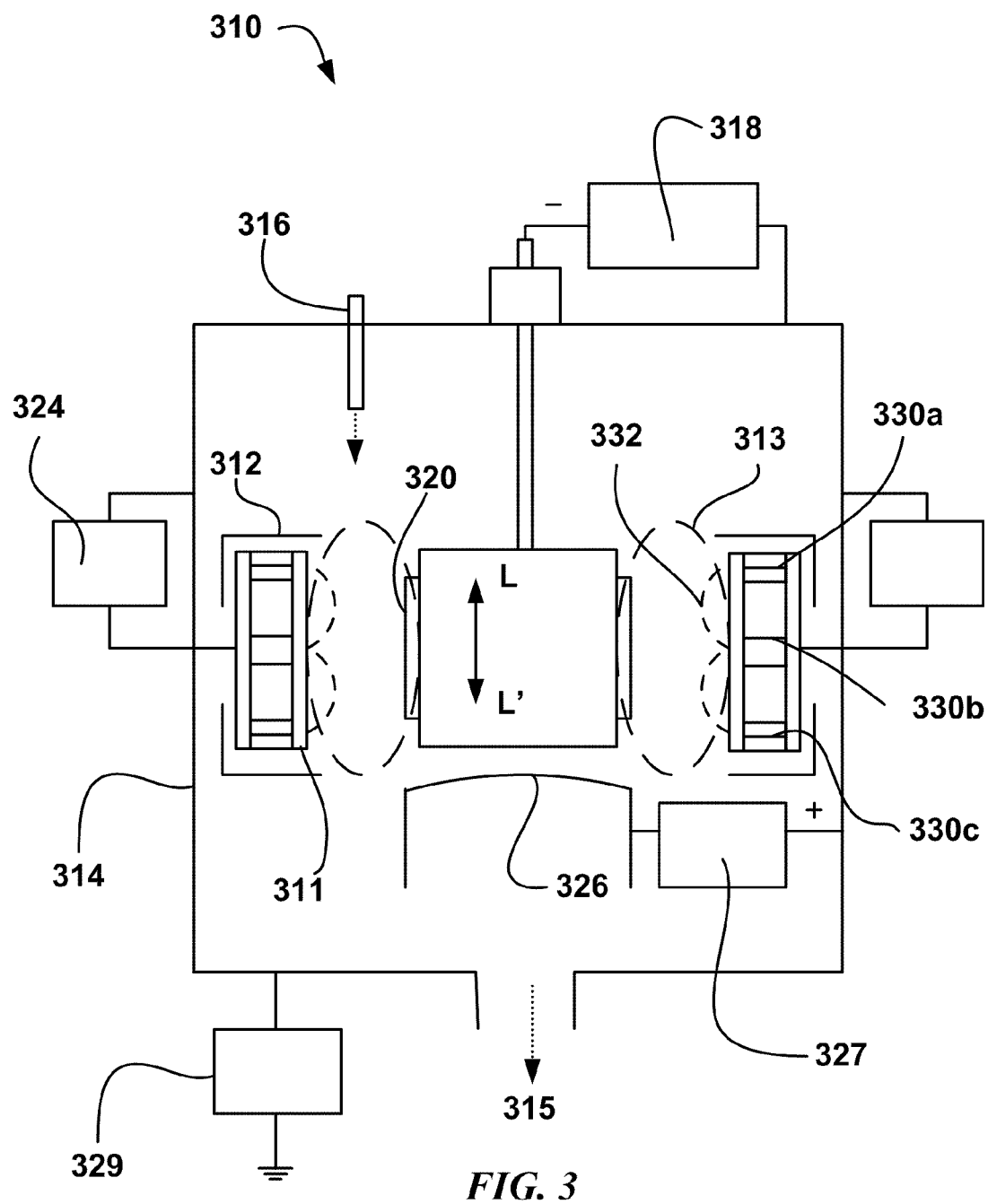
FIG. 3 illustrates an example of a magnetron sputtering system.

In a further example, the diffusion barrier and MCrAl coatings may be applied by a magnetron sputtering process, such as plasma enhanced magnetron sputtering, an example of which is illustrated in FIG. 3. While it may be appreciated that a single coating layer may be applied at a time, FIG. 3 illustrates an example wherein a dual magnetron sputtering system may be utilized to produce the coating layers. The magnetron sputtering system 310 may include one or more magnetrons 312, each supporting a sputter material target 311 in a vacuum chamber 314 having a gas port 316 and one or more vacuum pumps 315 in fluid communication with the vacuum chamber 314. The gas port 316 may be supplied by precursor supply system, described below, as well as by an inert gas feed. Inert gasses may include argon, krypton, xenon, etc., and it may be appreciated that in some examples, the precursor gasses may be carried by inert gas through the system.

The magnetron sputtering system may also include an electron source 326, such as a filament, which may discharge electrons into the system when heated to thermionic emission temperature. Examples of filaments may include tungsten or tantalum. Electron sources may also include, for example, hollow cathode(s), RF antenna(s) and microwave generator(s). The magnetron sputtering system 310 may provide an energy source 324 for negatively biasing the magnetron 312, an energy source 318 for negatively biasing the surface of the workpieces 320, and an energy source 327 for negatively biasing the electron source, as well as, in some embodiments, an energy source 329 for positively biasing the chamber wall 314. The energy source may be a voltage source and may be associated with circuitry. The energy sources may provide radio frequency (RF) or native voltage in the form of DC power or pulse DC power. Where DC power or pulse DC power may be contemplated, a voltage control may be activated to negatively bias the respective component.

The magnetron 312 may assume any structure or geometry that may be effective to produce a substantially uniform magnetron generated plasma 313 along the length L-L' of the substrates or workpieces 320. For example, the magnetron may be a planar magnetron, which may be understood as a magnetron that may include one or more permanent magnets aligned adjacent to one another with oppositely orientated poles. The ends of the magnets 330a and 330c may be the north pole of the respective magnet and the end of the adjacent magnet 330b may be the south pole or vice versa. The magnets generate north to south or south to north magnetic fields 332, which may be along the length of the sputter target material 311. The magnets may generally produce a magnetic field of 500 Gauss or more, including 1,000 Gauss or more.

The ion current density generated by the magnetron 312 may be relatively uniform along the length of the sputter target material 311. The ion current density generally may be from 0.01 mA/cm$^2$ to 500 mA/cm$^2$, including all values and increments therein, such as 20 mA/cm$^2$. The rate of decay of the sputter target material 311 and the amount of metal atoms deposited onto the surface of the workpieces 320 may be substantially uniform along the length of (L-L') of the workpieces 320.

Figure 4:
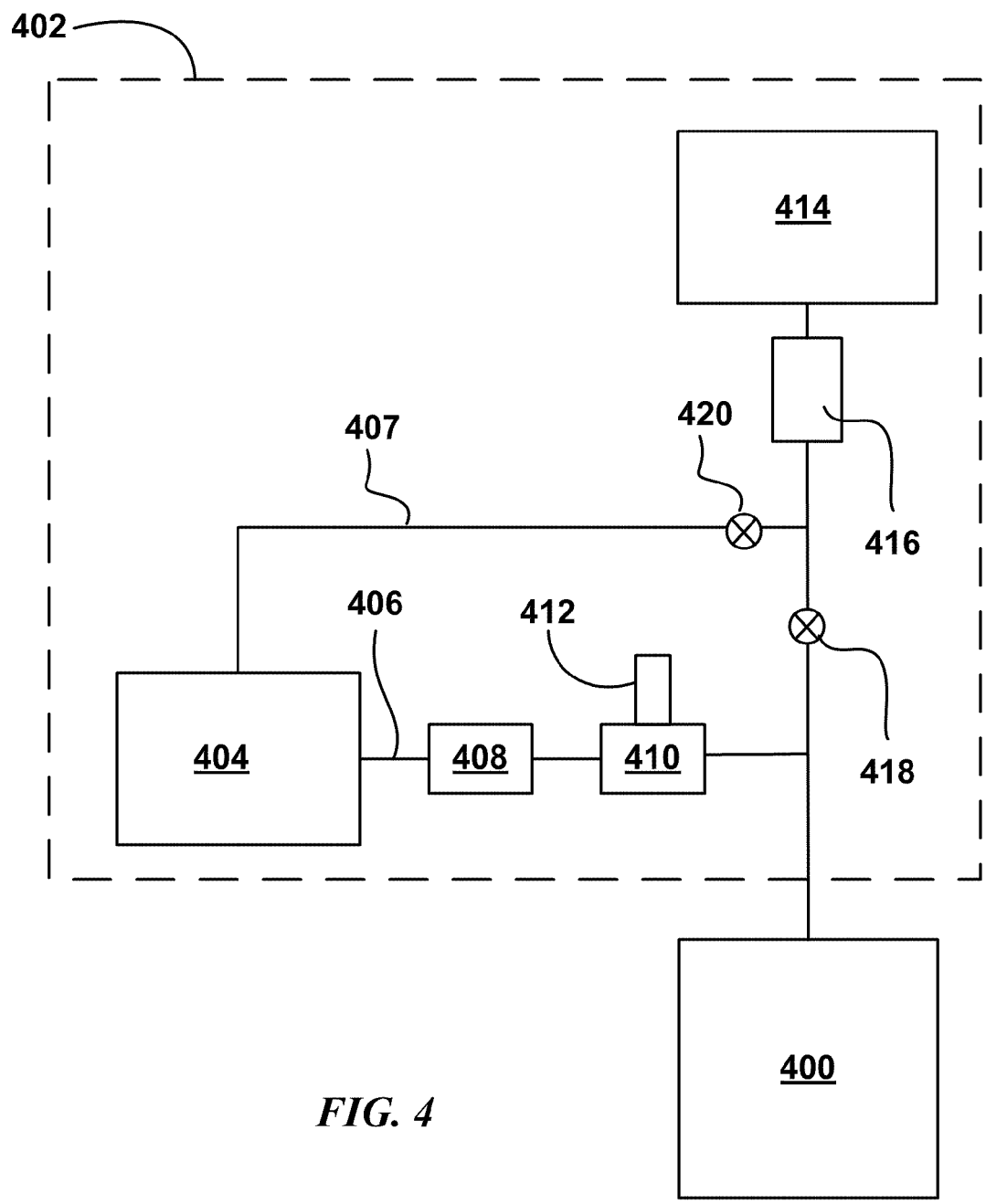
FIG. 4 illustrates an example of a precursor supply system for a sputtering system.

The precursor reactive gas may be provided to the process chamber 400 via a precursor supply system 402, an example of which is illustrated in FIG. 4. The precursors may be loaded into a container or vessel 404. The container may be in fluid communication with the process chamber by, for example, tubings 406. A mass flow controller 408 may be placed between the container and the process chamber to measure and/or control the flow of the precursors. In addition, a purging system 410 and process may be used to remove air from the precursor supply system. For example, in one embodiment, a vacuum port 412 may be provided to apply vacuum to the precursor supply system. The system, including the precursor container, the mass flow controller and/or tubings, may be heated. It may be appreciated that the inert gas supply 414 may tie into the precursor system or may operate separately from the precursor supply system. In such a manner, the inert gas supply 414 may also incorporate a mass flow controller 416 to measure and/or control the flow of the precursors as well as valve 418 to control the flow of the inert gas. In addition, the inert gas from the inert gas supply 414 may be used to carry the reactive gas from the reactive gas/precursor container 404 to the process chamber 400. The inert gas supply may communicate and/or be regulated through valve 420 and tubings 407 to the precursor container 404.

To produce the various diffusion barrier coatings contemplated herein, the process may begin by placing the substrate in the sputtering system on the work table and, optionally, cleaning the substrate. Referring again to FIG. 3, the substrate may be cleaned by reducing the atmospheric pressure in the sputtering system by evacuating at least a portion of the air out of the sputtering system by a vacuum pump 315. In some examples the pressure may be reduced to $10^{-6}$ to $10^{-5}$ torr, including all values and increments therein. An inert gas, such as argon gas, Ar, may then be supplied into the chamber through the gas port 316. The argon gas may be ionized prior to entering the chamber, or may be ionized after entering the chamber by collisions with electrons emitted from the electron source 326. A bias may be applied to any substrates provided in the chamber attracting the Ar+ ions to the substrates. Impingement of the Ar+ onto the substrates may clean the surface of the substrates removing contaminants and/or oxides from the surfaces. The argon may be provided at a flow rate in the range of 1 sccm to 100 sccm (standard cubic centimeters per minute), including all values and increments therein. In addition, the atmospheric pressure may be maintained in the range of 1 millitorr to 100 millitorr including all values and increments therein.

The diffusion barrier coating compositions may then be provided using, for example, plasma enhanced magnetron sputtering or hybrid chemical-physical vapor deposition using a target material and a reactive precursor gas. The target material may include transition metals such as iron, manganese, cobalt, nickel, chromium, etc., and in some examples one or more metalloids, such as aluminum or silicon. The precursor gas may include nitrogen, carbon, and/or oxygen, as well as, metalloids, such as silicon. It may be appreciated that, in addition to single component precursors, such as $N_2$ or $O_2$, the precursor gas may include relatively high molecular weight gasses, such as trimethyl silane $(CH_3)_3$—SiH.

In one embodiment, to form a coating including a transition metal or metalloid nitride, carbide or oxide, the transition metal or metalloid may be provided as the target material and the nitrogen, carbon or oxygen may be provided as the precursor gas. For example, in TiN coatings titanium, Ti, may be provided as the target material and nitrogen, $N_2$, may be provided as a reactive gas. Aluminum nitride may be similarly provided, wherein the aluminum, Al, may be provided in the target material and nitrogen, $N_2$, may be provided as a reactive gas.

In another embodiment, to form a transition metal/metalloid nitride, carbide or oxide coating including both a transition metal and a metalloid, the transition metal may be supplied by the target material and the metalloid, nitrogen, carbon, oxygen or combinations thereof may be supplied as a precursor gas. For example, in the case of TiSiCN coatings, trimethylsilane $(CH_3)_3$—SiH may be added to the nitrogen, $N_2$, precursor gas and the titanium may again be provided in the target material.

In some examples, the deposition time for the diffusion barrier coating may be in the range of 5 minutes to 100 minutes, including all values and increments therein. In addition, a power of 0.5 to 5 kW may be applied to each operating target, including all values and increments therein. Furthermore, the reactive precursor gas or gasses may be provided at a flow rate in the range of 1 sccm to 100 sccm, including all values and increments therein. Similar process conditions may be utilized for additional diffusion barrier coating layers.

The MCrAl coatings may then be deposited over the diffusion barrier coatings again using physical vapor deposition or thermal spray. In some examples, the MCrAl coatings may be applied by magnetron sputtering. The target materials may include or consist of one or more transition metals including nickel, iron, cobalt, chromium, tungsten, molybdenum, manganese, etc., and/or one or more metalloids including silicon. In some examples, the various transition metals may be provided using a first target and the metalloids, e.g., aluminum, may be provided by a second target. It may be appreciated that additional targets may also be provided, which may depend on the coating composition. In addition, a reactive gas may or may not be necessary to form the MCrAl coating layers. However, an inert gas may still be provided in the atmosphere of the process chamber.

For example, the MCrAl coatings may be deposited using plasma enhanced magnetron sputtering, wherein deposition times may range from 100 minutes to 600 minutes, including all values and increments therein. A power of 0.5 to 5 kW may be provided to the targets, including all values and increments therein. It may be appreciated that different power levels or bias may be applied to the individual targets. In one embodiment, approximately one quarter of the power applied to a target including one or more transition metals may be applied to a target including one or more metalloids. Accordingly, a target including one or more metalloids may receive power $P_1$ that is 20 to 40 percent of the power received by the target including the one or more transition metals $P_2$, including all values and increments therein, wherein $(0.40*P_2) \geq P_1 \geq (0.20*P_2)$.

In one example, a first target may be provided including iron, nickel, manganese, silicon and chromium and a second target may include aluminum. In another example, a first target may be provided including nickel and chromium, wherein chromium may be present in the range of 18 to 22 wt % of the target composition and the balance may be nickel, and a second target of aluminum may be provided. In a further example, a first target of nickel, cobalt, tungsten and chromium may be provided and in yet a further example, a first target of nickel, cobalt, silicon and chromium may be provided with aluminum targets.

The deposited MCrAl alloy may include $[M_aCr_bX_c]_y$ $Al_{(100-y)}$. M, Cr, and, optionally X, may be present in a range "y" of 85 to 95 wt % of the total composition and Al may be present in a range (100-y) of 5 to 15 wt % of the total composition, wherein in the total weight percent may equal 100 wt %. M may be a transition metal, including, for example iron, cobalt, nickel, manganese, tungsten, molybdenum, wherein the transition metal may be present in a range "a" from 70 to 90 wt % of "y", including all values and increments therein. Cr, chromium, may be present in a range "b" from 5 to 25 wt. % of "y", including all values and increments therein. In addition, X as an optional component, and if present (i.e., c does not equal 0), may then include a metalloid such as Si, C, P, etc., and may be present in the range of 0.1 to 5.0 wt % of "y". All of the above ranges may be available at all values and increments therein.

Figure 5A:
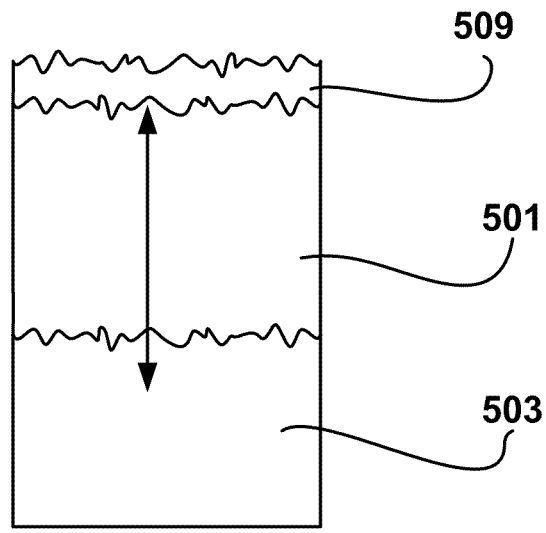
FIG. 5a illustrates an example of Al diffusing (as represented by the arrow) into substrate and into the MCrAl coating.
Figure 5B:
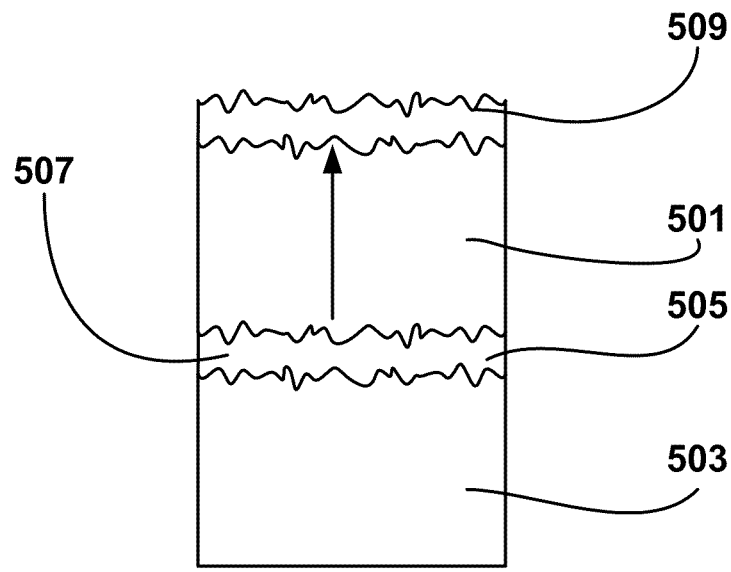
FIG. 5b illustrates an example of Al diffusing (as represented by the arrow) into the MCrAl coating, being restricted from diffusion into the substrate.

Thus, it may be appreciated that upon exposure to relatively high temperatures, (700° F. to 1000° F.,) and during thermal cycling the diffusion of aluminum Al out of the MCrAl coating 501 and into the substrate 503, as illustrated in FIG. 5a, may be reduced or prevented. Upon providing a diffusion barrier coating 505, as illustrated in FIG. 5b, the aluminum Al that is kept out of the substrate may then diffuse to the outer surface 507 of the MCrAl coating 501 and oxidize to form the protective $Al_2O_3$ oxide layer 509 and replenish the $Al_2O_3$ layer upon spallation. Furthermore, where aluminum is provided in the diffusion barrier layer, a portion of the aluminum therein may also diffuse into the MCrAl alloy providing additional aluminum for consumption in the $Al_2O_3$ oxide layer.

Upon thermal cycling, the substrate, including a diffusion barrier and MCrAl coatings, may exhibit an overall weight gain, in spite of any potential degree of spallation, of up to $0.0006$ g/cm$^2$. The weight gain may be measured by thermal cycling at a temperature of 1010° C., for up to 2105 cycles, wherein each cycle includes inserting a sample into a furnace and heating the furnace to the thermal cycling temperature, maintaining the furnace at that temperature for 50 minutes and then removing the specimen from the furnace and force air cooling for 10 minutes to room temperature. Periodically sample weight may be measured.

In addition, in some examples, the substrates including a diffusion barrier and MCrAl coatings may exhibit a total loss of Al in the MCrAl coating of 80 percent or less, including all values and increments therein, when thermally cycled, as described above, for 2105 cycles. Thus, it may be appreciated that a first amount of aluminum (weight percent of the MCrAl coating), $Al_1$, may be reduced upon thermal cycling to a second amount of aluminum (weight percent of the MCrAl coating), $Al_2$, wherein $Al_2 \geq (0.20*Al_1)$. It may be appreciated that the total Al loss may be dependent on the diffusion barrier coating layers, the substrate composition and/or the composition of the MCrAl alloy.

EXAMPLES

The following examples are presented for illustrative purposes only and therefore are not meant to limit the scope of the disclosure and claimed subject matter attached herein.

A number of samples were produced including diffusion barrier layers and MCrAl coatings using plasma enhanced magnetron sputtering. Three diffusion barrier coating layers were selected for the study including TiN, TiSiCN, and AlN and were deposited over an iron based alloy, 304SS, and a nickel based alloy, HAYNES 230. The iron based alloy is understood to have a composition of balance iron, <0.08 wt % carbon, 17.5-20 wt % chromium, 8-11 wt % nickel, <2 wt % manganese, <1 wt % silicon, <0.045 wt % phosphorous, <0.03 wt % sulfur. The nickel based alloy is understood to have the composition of balance nickel, 22 wt % chromium, 14 wt % tungsten, 2 wt % molybdenum, 3 wt % iron, 5 wt % cobalt, 0.5 wt % manganese, 0.4 wt % silicon, 0.3 wt % aluminum, 0.10 wt % carbon, 0.02 wt % lanthanum, 0.015 wt % boron. To deposit the TiN coatings, two Ti targets were used in a dual magnetron system in an Ar+$N_2$ environment. To deposit TiSiCN, two Ti targets were used with $N_2$ and trimethylsilane precursor gasses, provided with an inert Ar carrier. To deposit AlN, one aluminum target was used with $N_2$ precursor gas, provided with an inert Ar carrier gas. In addition, various MCrAl alloy compositions were deposited over bare substrates and substrates including the various diffusion barrier layers. For example, a first target including FeCrNi was used with another target of Al. In addition, a target including Ni-20Cr was used with another target of Al. The deposition parameters for the various coatings are illustrated in Table 1 below.

TABLE 1

Processing Parameters for Selected Examples of Barrier Coatings and MCrAl Coatings

| No. | Sample | Coating | Deposit Time (h) | T1 Mat'l | P1 (kW) | T2 Mat'l | P2 (kW) | QN2 (sccm) | Q TMS (sccm) | Coating Structure |
|---|---|---|---|---|---|---|---|---|---|---|
| 1 | Bare 304 SS | TiN | 0.33 | Ti | 4 | Ti | 4 | 50 | 0 | TiN |
| 2 | Bare 304 SS | TiSiCN | 0.33 | Ti | 4 | Ti | 4 | 50 | 9 | TiSiCN |
| 3 | Bare 304 SS | AlN | 1 | 0 | 0 | Al | 1.1 | 75 | 0 | AlN |
| 4 | Bare 304 SS | SS + Al | 8 | 304SS | 4 | Al | 1.1 | 0 | 0 | SAL* |
| 5 | TiN Coated 304 SS | SS + Al | 8 | 304SS | 4 | Al | 1.1 | 0 | 0 | TiN/SAL* |
| 6 | TiSiCN coated 304 SS | SS + Al | 8 | 304SS | 4 | Al | 1.1 | 0 | 0 | TiSiCN/ SAL* |
| 7 | Bare 304 SS | AlN barrier SS + Al | 1 8 | 0 304SS | 0 4 | Al Al | 1.1 1.1 | 75 0 | 0 0 | AlN/ SAL* |
| 8 | TiN Coated 304 SS | AlN barrier SS + Al | 1 8 | 0 304SS | 0 4 | Al Al | 1.1 1.1 | 75 0 | 0 0 | TiN/AlN/ SAL* |
| 9 | TiSiCN coated 304 SS | AlN barrier SS + Al | 1 8 | 0 304SS | 0 4 | Al Al | 1.1 1.1 | 75 0 | 0 0 | TiSiCN/ AlN/ SAL* |
| 10 | Bare Haynes 230 | Ni20Cr + Al | 6 | Ni—20Cr | 4 | Al | 1.1 | 0 | 0 | NiCrAl |
| 11 | TiN coated Haynes 230 | Ni20Cr + Al | 6 | Ni—20Cr | 4 | Al | 1.1 | 0 | 0 | TiN/ NiCrAl |
| 12 | TiSiCN coated Haynes 230 | Ni20Cr + Al | 6 | Ni—20Cr | 4 | Al | 1.1 | 0 | 0 | TiSiCN/ NiCrAl |
| 13 | Bare Haynes 230 | Al barrier Ni20Cr + Al | 1 3.5 | 0 Ni—20Cr | 0 4 | Al Al | 1.1 1.1 | 50 0 | 0 0 | AlN/ NiCrAl |
| 14 | TiN coated Haynes 230 | Al barrier Ni20Cr + Al | 1 3.5 | 0 Ni—20Cr | 0 4 | Al Al | 1.1 1.1 | 50 0 | 0 0 | TiN/AlN/ NiCrAl |
| 15 | TiSiCN coated Haynes 230 | Al barrier Ni20Cr + Al | 1 3.5 | 0 Ni—20Cr | 0 4 | Al Al | 1.1 1.1 | 50 0 | 0 0 | TiSiCN/ AlN/ NiCrAl |
| 16 | Bare 304 SS | AlN barrier H160 | 0.33 3.5 | 0 H160 | 0 4 | Al Al | 0.95 0.95 | 50 0 | 0 0 | Al/NiCoSiCrAl |
| 17 | Bare Haynes 230 | AlN barrier H160 | 0.33 3.5 | 0 H160 | 0 4 | Al Al | 0.95 0.95 | 50 0 | 0 0 | Al/NiCoSiCrAl |
| 18 | Bare 304 SS | AlN barrier H120 | 0.33 3.5 | 0 H120 | 0 4 | Al Al | 0.95 0.95 | 50 0 | 0 0 | Al/FeNiCrAl |
| 19 | Bare Haynes 203 | AlN barrier H120 | 0.33 3.5 | 0 H120 | 0 4 | Al Al | 0.95 0.95 | 50 0 | 0 0 | Al/FeNiCrAl |
| 20 | Bare 304 SS | AlN barrier H188 | 0.33 3.5 | 0 H188 | 0 4 | Al Al | 0.95 0.95 | 50 0 | 0 0 | AlN/ CoNiWCrAl |
| 21 | Bare Haynes 230 | AlN barrier H188 | 0.33 3.5 | 0 H188 | 0 4 | Al Al | 0.95 0.95 | 50 0 | 0 0 | AlN/ CoNiWCrAl |

*SAL is SS (stainless steel) and Al

The material compositions of the target and substrate samples are provided in Table 2.

TABLE 2

Material Composition of the Target and Substrate

| Alloy | Used As | Fe | Ni | Co | W | Mo | Mn | Si | Cr |
|---|---|---|---|---|---|---|---|---|---|
| 304 SS | Target/Sample | Balance | 9 | | | | 2 | 1 | 18 |
| 310 SS | Target | Balance | 20 | | | | 2 | 1.5 | 25 |
| Ni20Cr | Target | | Balance | | | | | | 20 |
| Haynes 120 | Target | Balance | 37 | | | | | | 24 |
| Haynes 166 | Target | | Balance | 30 | | | | 3 | 28 |
| Haynes 180 | Target | | 23 | Balance | 14 | | | | 22 |
| Haynes 230 | Sample | 3 | Balance | 5 | 14 | 2 | 0.5 | 0.4 | 22 |
| P91 | Sample | Balance | 0.4 | | | 1 | 0.5 | 0.4 | 9 |

A number of MCrAl alloy coatings including Ni-20Cr-10Al and diffusion barrier layers of AlN, TiN and TiSiCN were characterized. The diffusion barrier coating layers were in the range of 1.5 µm to 2.1 µm. Energy Dispersive X-ray Spectroscopy, (EDS) was performed in the diffusion barrier coating and in the NiCrAl coating. The diffusion barrier layer exhibited relatively high levels of Ni, and Al or Ti, while the MCrAl coating exhibited high relatively high levels of Ni, Cr and Al. The chemical composition of the MCrAl coatings is shown in Table 3.

TABLE 3

Semi-Quantitative Chemical Composition of As-Deposited Ni—Cr—Al Coating on the Diffusion Barrier Interlayer, wt %

| Diffusion Barrier Layer | Al | Cr | Ni |
|---|---|---|---|
| Al/N | 12.14 | 18.66 | Balance |
| TiN | 11.75 | 18.73 | Balance |
| TiSiCN | 11.85 | 18.72 | Balance |

Figure 6A:
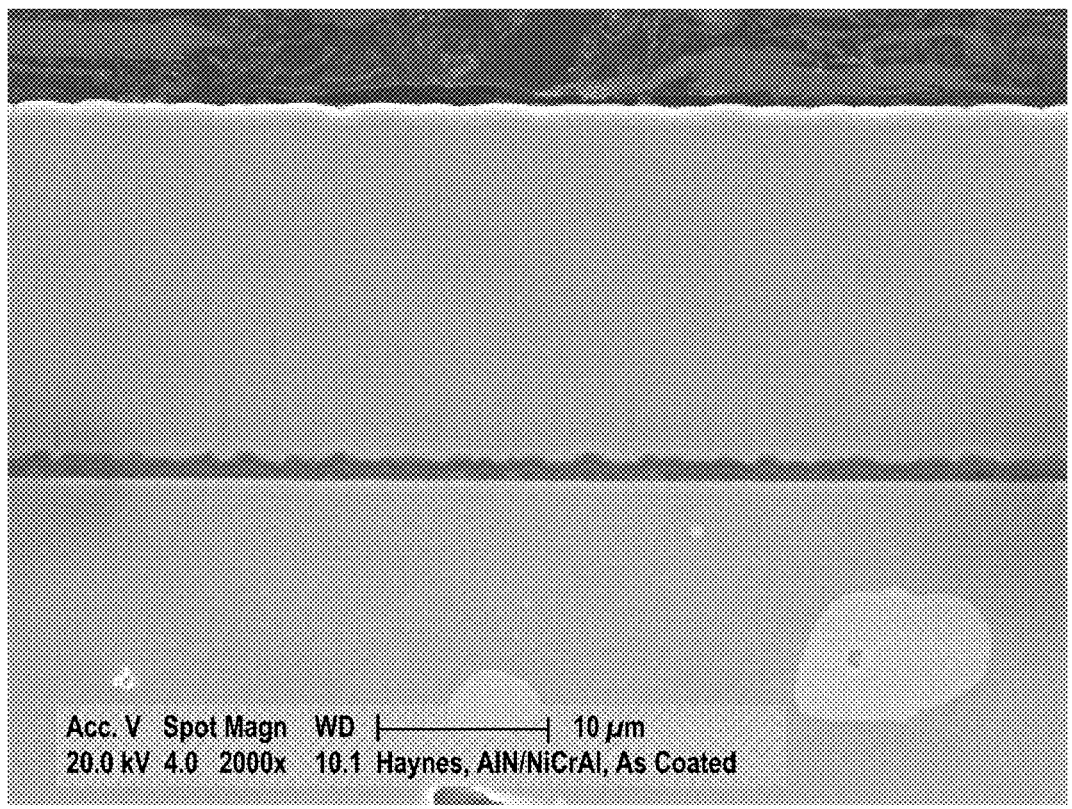
FIGS. 6a through 6c illustrates examples of cross-sections of the as-deposited coatings including a diffusion barrier layer and a Ni—Cr—Al coating.
Figure 6B:
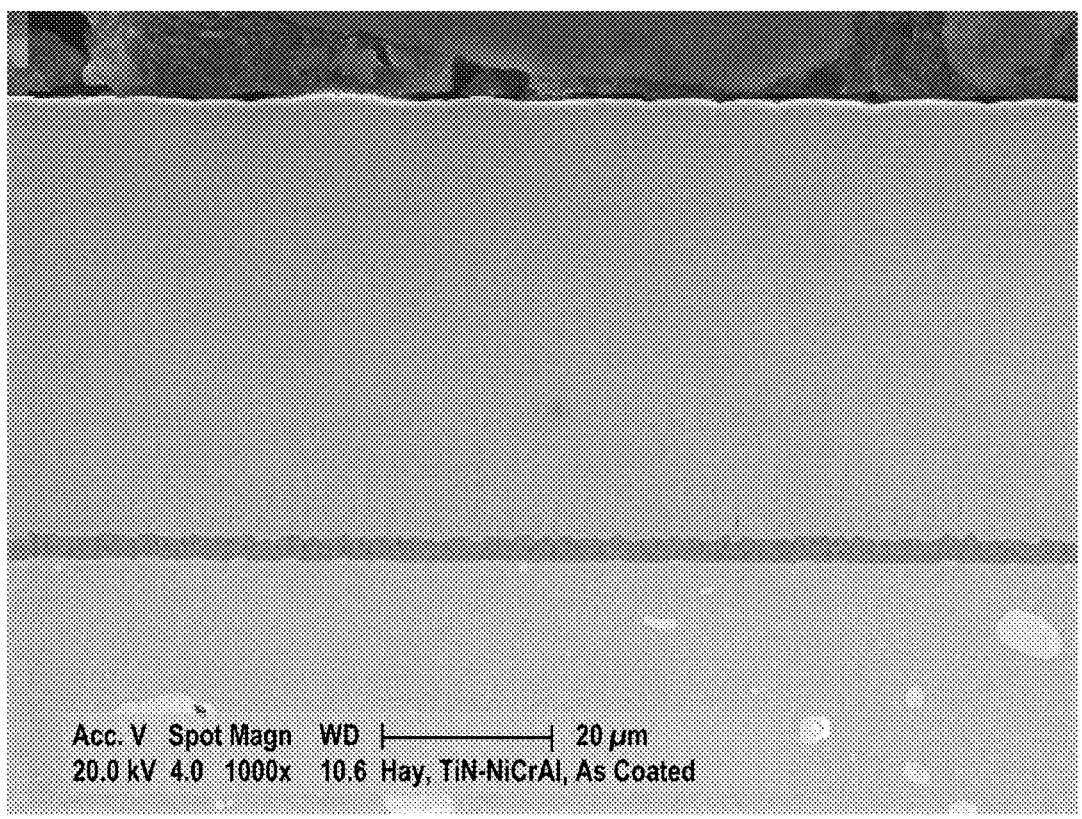
Figure 6C:
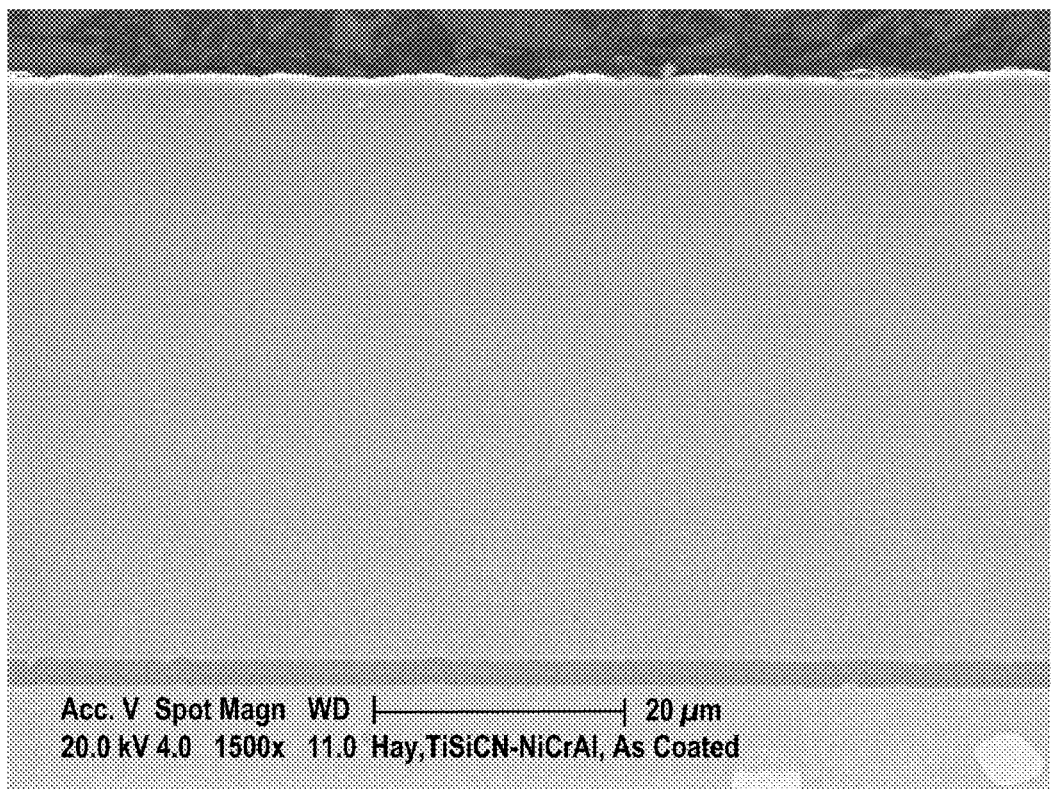

As can be seen from the above, the aluminum content varied from 11.75 wt. % to 12.14 wt. %. Cross sections of the as-deposited coatings are shown in FIGS. 6a through 6c, wherein FIG. 6a illustrates an as-deposited Ni—Cr—Al coating with an AlN diffusion barrier layer, FIG. 6b illustrates an as-deposited Ni—Cr—Al coating with a TiN diffusion barrier layer, and FIG. 6c illustrates an as-deposited Ni—Cr—Al coating with a TiSiCN diffusion barrier layer.

Figure 7:
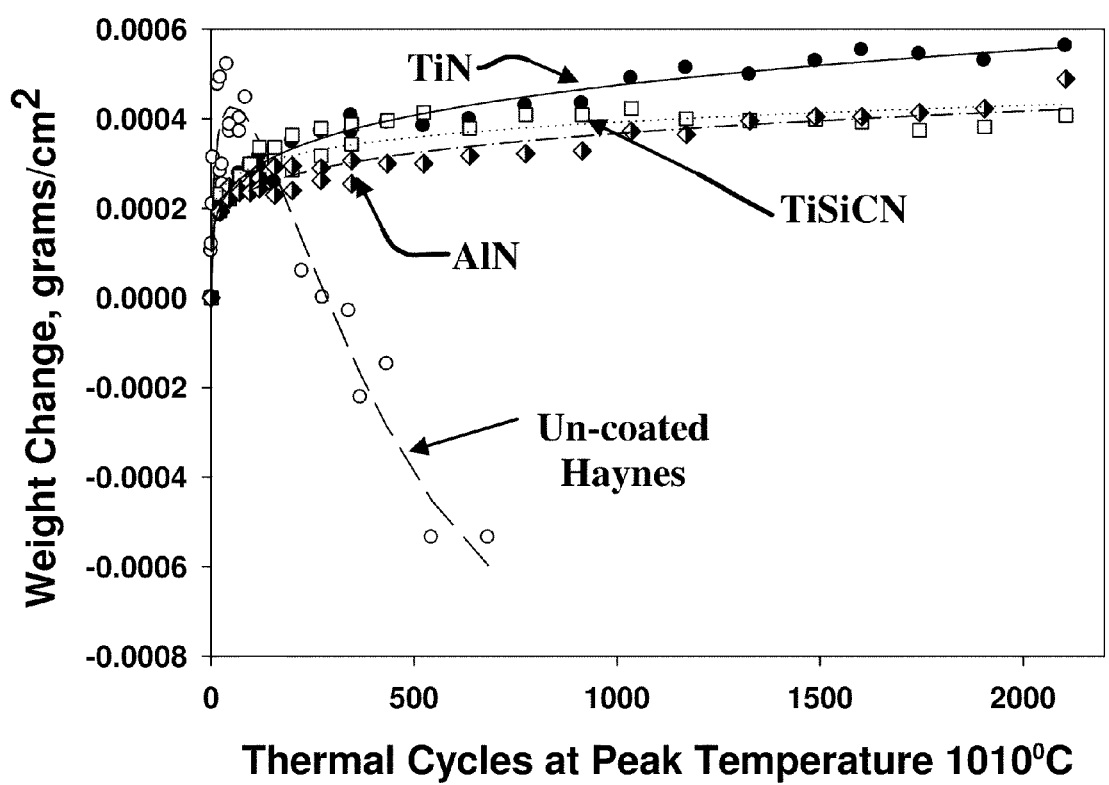
FIG. 7 illustrates a chart comparing the weight change results of an uncoated and sputter deposited Ni-20Cr-10Al coating with different diffusion barrier coatings on a nickel based alloy.

Cyclic oxidation tests were conducted on the NiCrAl and diffusion barrier coated nickel based alloy samples. The diffusion barrier layers included TiN, TiSiCN and AlN coating. The samples were thermally cycled in a programmable, automated, drop bottom furnace. The samples, including the coatings, were inserted into the furnace which was maintained at a peak temperature and held at that temperature for 50 minutes. Thereafter, the samples were removed and forced air cooled for 10 minutes to room temperature. The samples were then again reinserted into the furnace for another 50 minutes and the cycle repeated. The thermal testing was periodically interrupted at intervals to weigh the samples. The mass (weight) change results were recorded as a function of cycles. FIG. 7 illustrates a chart comparing the weight change results of an uncoated and sputter deposited Ni-20Cr-10Al coating with different diffusion barrier coatings on the nickel based alloy.

Furthermore, the microstructure and chemical composition of the samples were examined. A section of each sample was removed after 346 thermal cycles and 2105 thermal cycles and the Al content in the overall coating was determined using EDS. Measurements were made at several locations excluding the $Al_2O_3$ scale and the Al-rich particles. The Al content in the NiCrAl coatings with and without diffusion barrier layers after thermal exposure is illustrated in Table 4.

TABLE 4

Aluminum Content in the NiCrAl Coating Before and After Thermal Cycling Between 1010° C. and 25° C.

| Diffusion Barrier Layer | Number of Thermal Cycles | Al Content in the NiCrAl (wt. %) |
|---|---|---|
| No interlayer | 0 | 10.56 |
| No interlayer | 347 | 1.71 |
| No interlayer | 1472 | 0.69 |
| AlN | 0 | 12.14 |
| AlN | 246 | 10.9 |
| AlN | 2105 | 8.22 |
| TiN | 0 | 11.75 |
| TiN | 346 | 11.73 |
| TiN | 2105 | 8.88 |
| TiSiCN | 0 | 11.82 |
| TiSiCN | 346 | Not determined |
| TiSiCN | 2105 | 2.94 |

As can be seen from the above, the overall Al content in the NiCrAl coating without a diffusion barrier dropped from 10.56 wt. % in the as-deposited condition to 1.71 wt. % after 347 exposure cycles and to 0.69 wt. % after 1472 exposure cycles. Accordingly, the Al concentration is reduced by a total of approximately 93.5% in the coating. The Al was almost all consumed after 1580 cycles.

Figure 8:
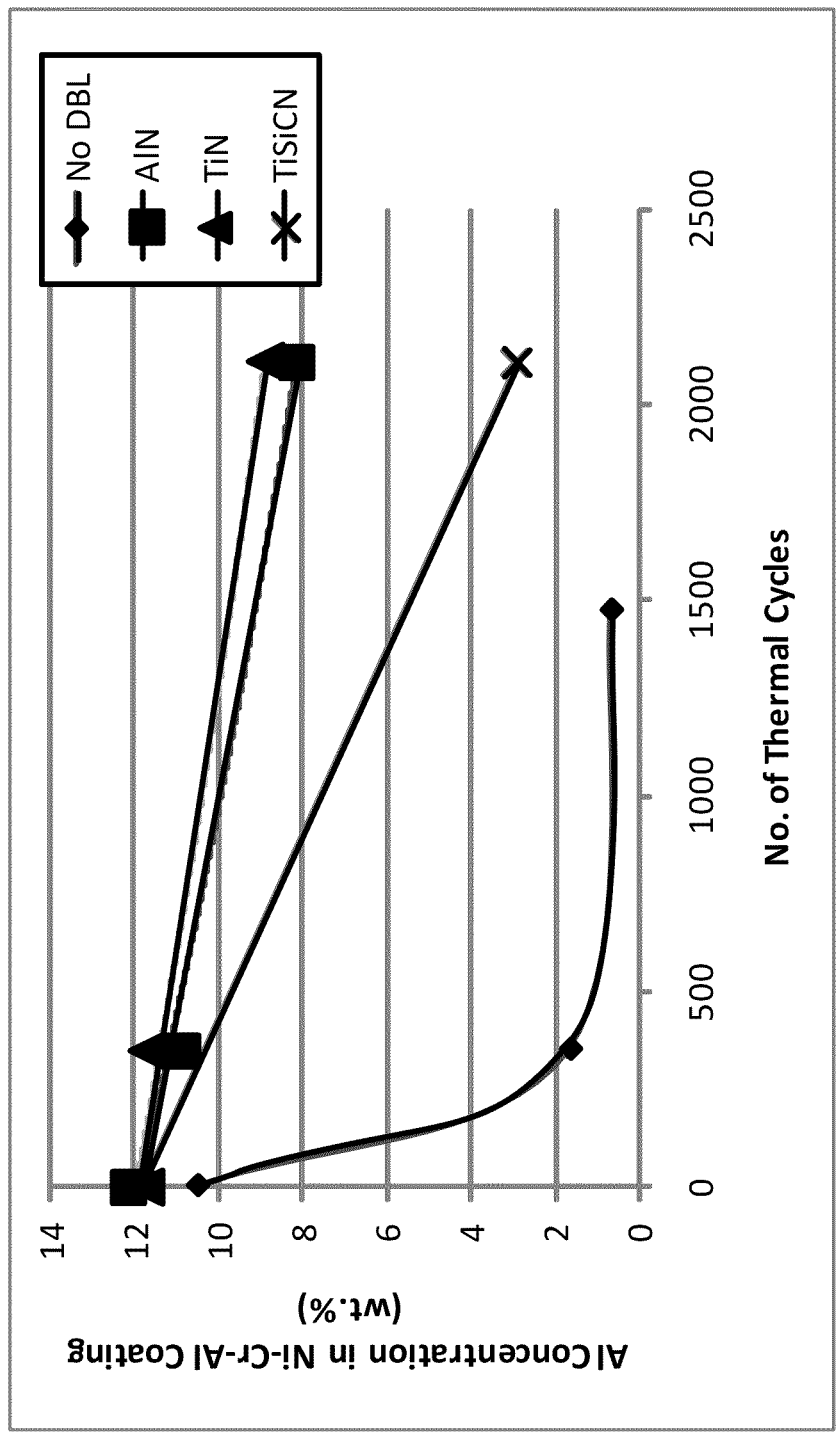
FIG. 8 illustrates the effect of nitride barrier coatings on the Al concentration in Ni-20Cr-10Al coatings.

In contrast, the Al content in the NiCrAl coatings including the diffusion barrier layers dropped no more than a total of approximately 75%. For example, with the AlN diffusion barrier layers, the NiCrAl coating included 12.14 wt. % aluminum as-deposited. After 246 exposure cycles the content dropped to 10.9 wt % and then after 2105 exposure cycles, dropped to 8.22 wt. %. In the samples including a TiN diffusion barrier layer, the Al content of the NiCrAl was 11.75 wt. % as deposited and dropped to 11.73 wt. % after 346 exposure cycles and to 8.88 wt. % after 2105 exposure cycles. In the samples including a TiSiCN diffusion barrier layer the Al content of the NiCrAl was 11.82 wt. % as deposited and dropped to 2.94 wt. % after 2105 exposure cycles. These trends are illustrated in the plot of FIG. 8.

Figure 9:
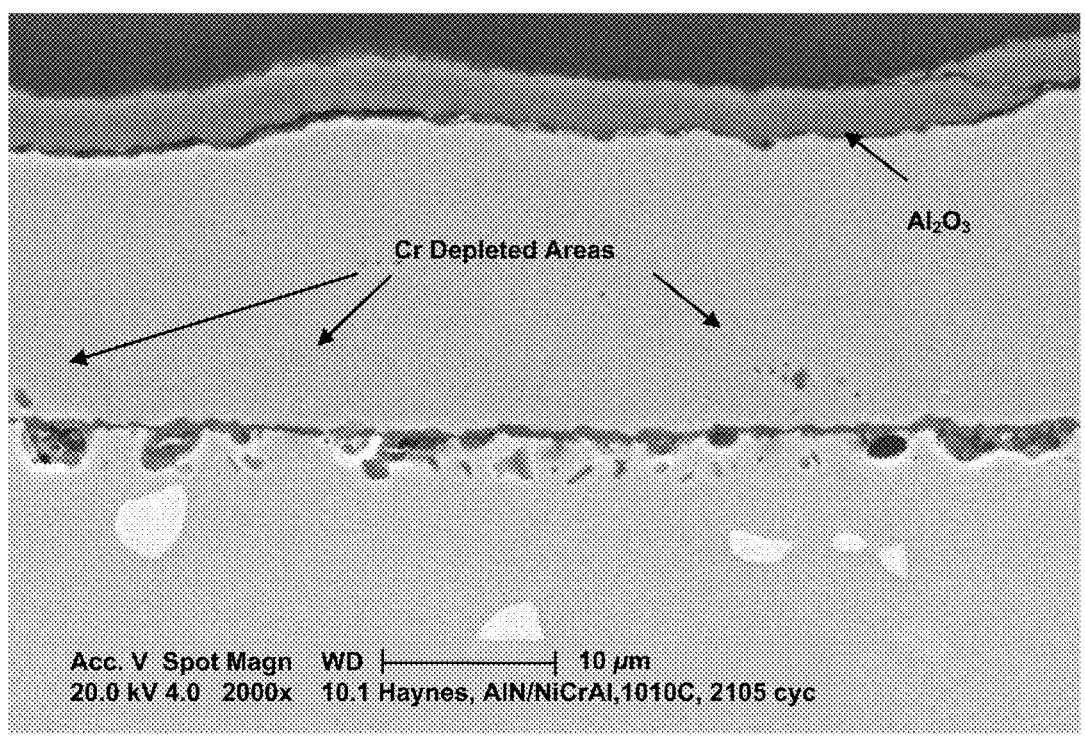
FIG. 9 illustrates cross sections of a Ni-20Cr-10Al coating with a AlN diffusion barrier coating after 2105 exposure cycles.
Figure 10:
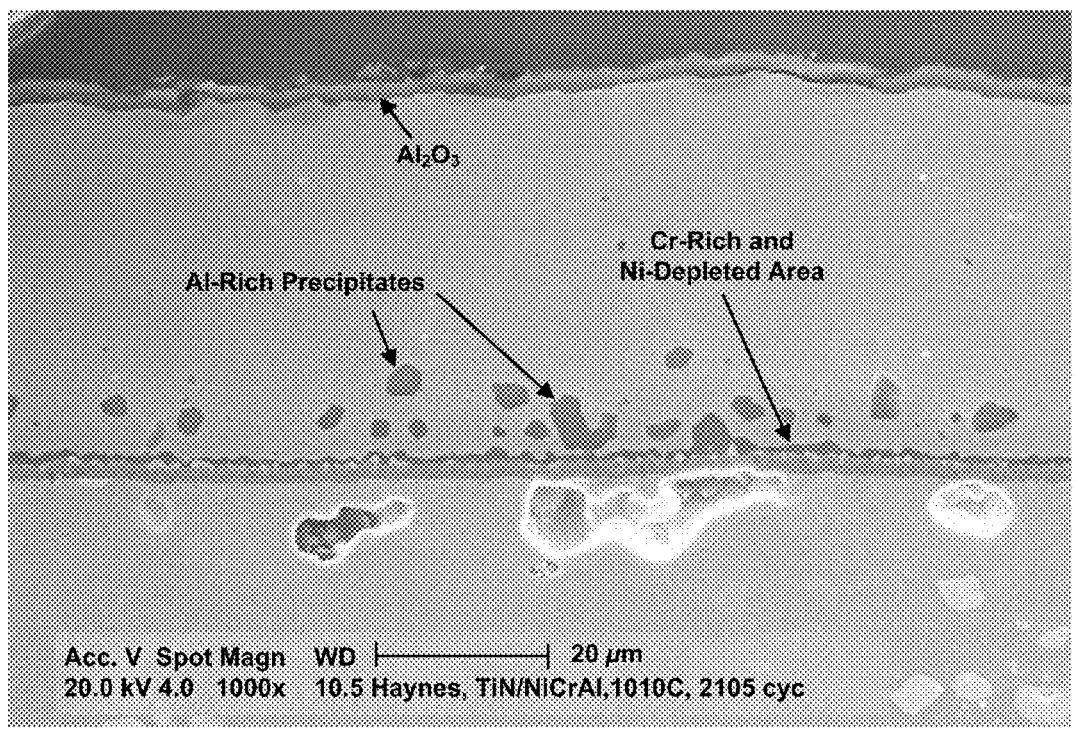
FIG. 10 illustrates cross sections of a Ni-20Cr-10Al coating with a TiN diffusion barrier coating after 2105 exposure cycles.
Figure 11:
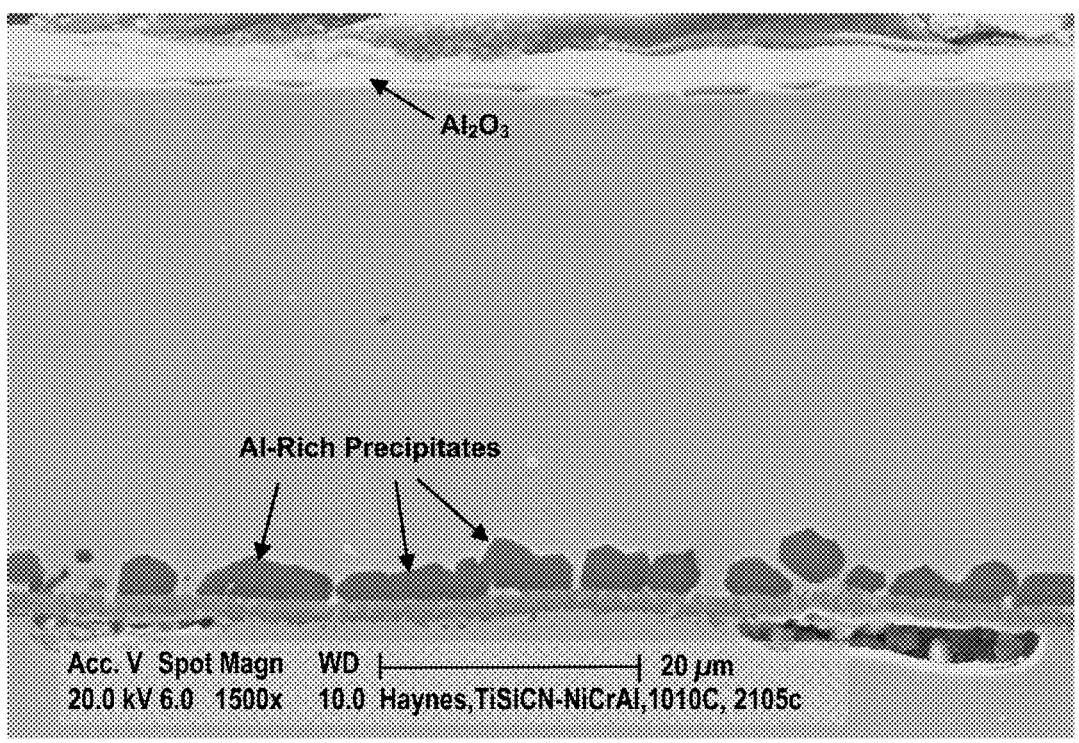
FIG. 11 illustrates cross sections of a Ni-20Cr-10Al coating with a TiSiCN diffusion barrier coating after 2105 exposure cycles.

FIGS. 9 through 11 show the cross-sections of the three coatings after 2105 cycles of exposure. All three coatings exhibited a relatively continuous $Al_2O_3$ scale formed on the surface of the MCrAl layer.

With regard to the sample including the AlN diffusion barrier coating, seen in FIG. 9, the AlN coating exhibited a degree of disintegration after thermal exposure. In addition, Cr-depleted areas were formed in the NiCrAl coating proximal to the AlN diffusion barrier coating. The relatively high concentration of Al in the AlN diffusion barrier layer appeared to slow down the inward diffusion of Al.

With regard to the sample including the TiN diffusion barrier coating, seen in FIG. 10, degradation of the TiN coating was not observed after thermal exposure. Furthermore, Cr-rich and Ni-depleted areas were found in the NiCrAl coating near the TiN diffusion barrier layer. In addition, the presence of the TiN diffusion barrier layer appeared to promote precipitation of Al-rich particles in the coating near the diffusion barrier layer.

Figure 12A:
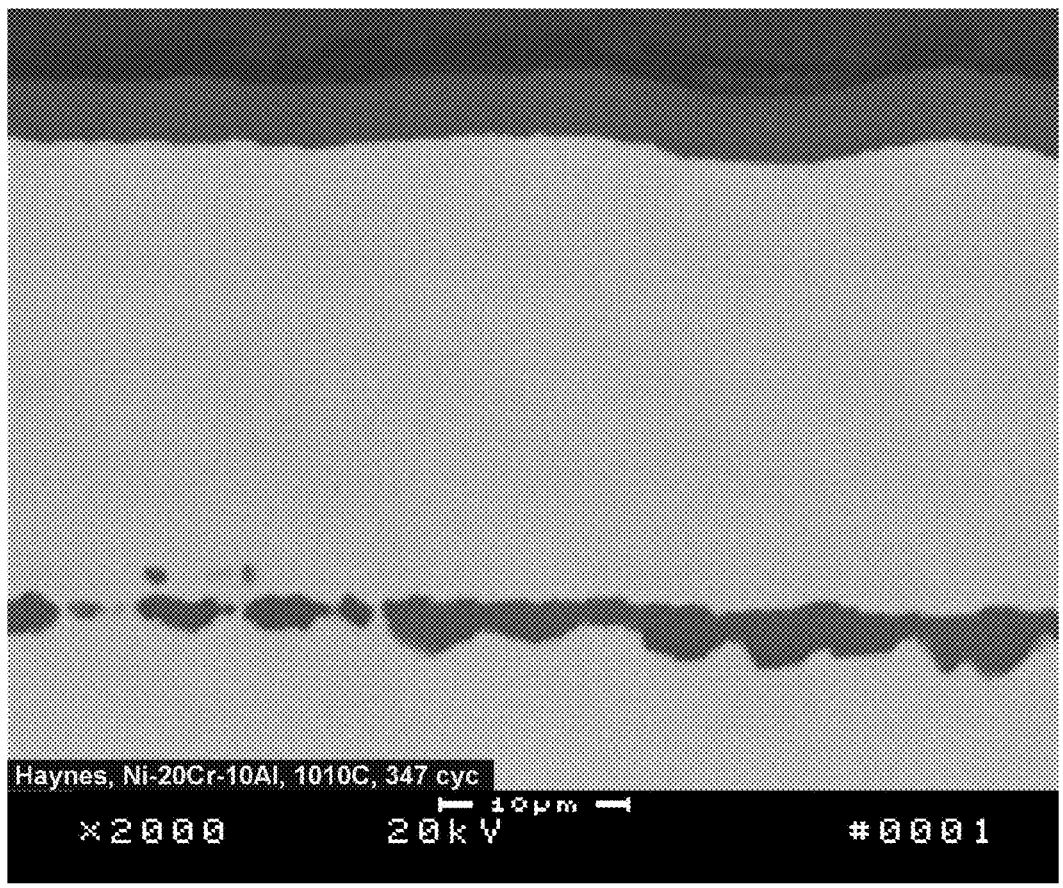
FIGS. 12a and 12b illustrates cross sections of a Ni-20Cr-10Al coating on Haynes 230 samples without a diffusion barrier coating after (a) 347 cycles and (b) 1472 cycles exposure at the peak temperature of 1010° C.
Figure 12B:
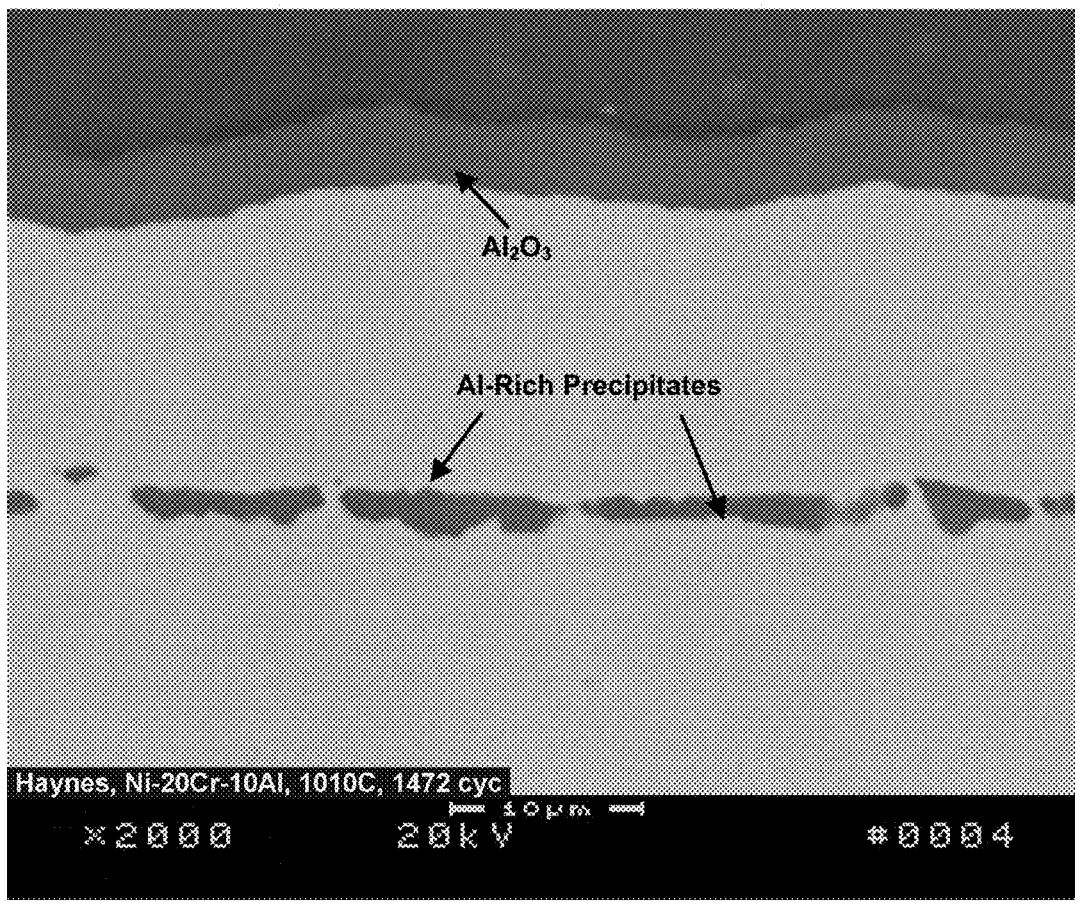

With regard to the samples including the TiSiCN diffusion barrier coating, seen in FIG. 11, degradation of the TiSiCN barrier layer was also not observed after thermal exposure. The presence of Al-rich particles was relatively greater in the TiSiCN samples than those including the TiN diffusion barrier layer. Furthermore, similar Al-rich particles were observed in the NiCrAl coated samples without diffusion barrier layers at the coating/substrate interface as seen in FIG. 12. In sum, without the diffusion barrier layers, the Al appeared to diffuse into the substrate.

The foregoing description of several methods and embodiments has been presented for purposes of illustration. It is not intended to be exhaustive or to limit the claims to the precise steps and/or forms disclosed, and obviously many modifications and variations are possible in light of the above teaching. It is intended that the scope of the invention be defined by the claims appended hereto.

What is claimed is:

1. A method of forming a diffusion barrier coating system between a substrate and coating comprising:
    depositing a diffusion barrier coating onto at least a portion of a substrate surface, wherein said diffusion barrier coating comprises at least two compositionally different layers,
    (i) a first layer having a composition selected from the group consisting of TaN, WN, Ti—Si—N, Zr—Si—N, Ta—Si—N, and Ti—Si—C—N; and
    (ii) a second layer having at least 50 at % aluminum selected from the group consisting of $Al_2O_3$, Al, and AlN, wherein said second layer is distal from said substrate surface,
    wherein said diffusion barrier coating layers are deposited by vapor deposition by providing a precursor gas including an element selected from the group consisting of O, N, C, and silicon at a flow rate of 1 sccm to 100 sccm, and providing a target including an element selected from the group consisting of tantalum, titanium, tungsten, zirconium, silicon, and aluminum and operating said target at a power in the range of 0.5 kW to 5kW for a deposition time in the range of 5 minutes to 100 minutes; and subsequently
    depositing $[M_aCr_bX_c]_yAl_{(100-y)}$ coating distinct from the second layer of the diffusion barrier coating on at least a portion of said diffusion barrier coating, wherein
    M is selected from the group consisting of iron, cobalt, nickel, manganese, tungsten, and molybdenum,
    X is selected from the group consisting of a carbon and phosphorous, and
    "y" is in the range of 85 wt % to 95 wt % of the total composition, "a" is in the range of 70 wt % to 90 wt % of "y", "b" is in the range of 5 wt % to 25 wt % of "y", and "c" is in the range of 0.1 wt % to 5 wt % of "y",
    wherein said $[M_aCr_bX_c]_yAl_{(100-y)}$ coating is deposited by vapor deposition by utilizing a first target including chromium and at least one transition metal selected from the group consisting of iron, cobalt, nickel, manganese, tungsten, and molybdenum and a second target including aluminum, wherein said second target is operated at a power $P_1$ that is in the range of 20 to 40 percent of a power $P_2$ said first target is operated, for a deposition time in the range of 100 minutes to 600 minutes, and
    wherein said $[M_aCr_bX_c]_yAl_{(100-y)}$ coating exhibits a weight gain of up to 0.0006 g/cm$^2$ and a total loss in aluminum of 80 percent or less when thermally cycled at temperatures of 1010° C. for 50 minutes and force air cooling to room temperature for 10 minutes, for up to 2015 cycles.

2. The method of claim 1, wherein said diffusion barrier coating includes at least two layers and said layers exhibit a thickness in the range of 0.1 µm to 10 µm individually.

3. The method of claim 1, wherein said diffusion barrier coating exhibits a thickness in the range of 0.1 µm to 10 µm in combination.

4. A method of forming a diffusion barrier coating system between a substrate and a coating comprising:
    depositing a diffusion barrier coating onto at least a portion of a substrate surface, wherein said diffusion barrier coating comprises at least two compositionally different layers,
    (i) a first layer having a composition selected from the group consisting of Ti—Si—N, Zr—Si—N, Ta—Si—N, and Ti—Si—C—N; and
    (ii) a second layer having at least 50 at % aluminum selected from the group consisting of $Al_2O_3$, Al, and AlN, wherein said second layer is distal from said substrate surface,
    wherein said diffusion barrier coating layers are deposited by vapor deposition by providing a precursor gas including an element selected from the group consisting of O, N, C, and silicon at a flow rate of 1 sccm to 100 sccm, and providing a target including an element selected from the group consisting of tantalum, titanium, zirconium, silicon, and aluminum and operating said target at a power in the range of 0.5 kW to 5 kW for a deposition time in the range of 5 minutes to 100 minutes; and subsequently
    depositing $[MCr]_yAl_{(100-y)}$ coating distinct from the second layer of the diffusion barrier coating on at least a portion of said diffusion barrier coating, wherein
    M is selected from the group consisting of iron, cobalt, nickel, manganese, tungsten, and molybdenum, and
    "y" is in the range of 85 wt % to 95 wt % of the total composition,
    wherein said $[MCr]_yAl_{(100-y)}$ coating is deposited by vapor deposition by utilizing a first target including chromium and at least one transition metal selected from the group consisting of iron, cobalt, manganese, tungsten and molybdenum, and a second target including aluminum, wherein said second target is operated at a power $P_1$ that is in the range of 20 to 40 percent of a power $P_2$ said first target is operated, for a deposition time in the range of 100 minutes to 600minutes, and
    wherein said $[MCr]_yAl_{(100-y)}$ coating exhibits a weight gain of up to 0.0006 g/cm$^2$ and a total loss in aluminum of 80 percent or less when thermally cycled at temperatures of 1010° C. for 50 minutes and force air cooling to room temperature for 10 minutes, for up to 2015 cycles.

* * * * *